US012695053B2

(12) United States Patent
Fang et al.

(10) Patent No.: US 12,695,053 B2
(45) Date of Patent: Jul. 28, 2026

(54) SELF-REFERENCING HEALTH MONITORING SYSTEM FOR MULTI-BEAM SEM TOOLS

(71) Applicant: ASML Netherlands B.V., Veldhoven (NL)

(72) Inventors: Wei Fang, Milpitas, CA (US); Lingling Pu, San Jose, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 442 days.

(21) Appl. No.: 17/639,322

(22) PCT Filed: Aug. 20, 2020

(86) PCT No.: PCT/EP2020/073446
§ 371 (c)(1),
(2) Date: Feb. 28, 2022

(87) PCT Pub. No.: WO2021/037696
PCT Pub. Date: Mar. 4, 2021

(65) Prior Publication Data
US 2022/0319805 A1      Oct. 6, 2022

Related U.S. Application Data

(60) Provisional application No. 62/893,139, filed on Aug. 28, 2019.

(51) Int. Cl.
*H01J 37/26* (2006.01)
*H01J 37/28* (2006.01)

(52) U.S. Cl.
CPC ............ *H01J 37/265* (2013.01); *H01J 37/28* (2013.01); *H01J 2237/24514* (2013.01); *H01J 2237/24592* (2013.01); *H01J 2237/282* (2013.01)

(58) Field of Classification Search
None
See application file for complete search history.

(56) References Cited

U.S. PATENT DOCUMENTS 5,969,273 A * 10/1999 Archie ................... G01Q 40/00
356/501
7,831,083 B1 11/2010 Lauber
(Continued)

FOREIGN PATENT DOCUMENTS

EP          2197018 A1 *  6/2010  ............. G06T 5/006
JP          H0669108 A      3/1994
(Continued)

OTHER PUBLICATIONS

Notice of Reasons for Rejection from the Japan Patent Office issued in related Japanese Patent Application No. 2022-508482; mailed Aug. 4, 2023 (7 pgs.).
(Continued)

*Primary Examiner* — Matthew G Marini
(74) *Attorney, Agent, or Firm* — FINNEGAN, HENDERSON, FARABOW, GARRETT & DUNNER LLP

(57) ABSTRACT
Systems and methods for image enhancement are disclosed. A method for enhancing an image may include receiving records of a performance metric for beams of the multi-beam system in an imaging process, each record associated with a beam. The method may also include determining whether an abnormality of a beam occurs based on a baseline value determined using a portion of the records. The method may further include providing an abnormality indication in response to the determination that the abnormality has occurred.

15 Claims, 5 Drawing Sheets

(56) References Cited

U.S. PATENT DOCUMENTS

| | | | |
|---|---|---|---|
| 10,020,166 B1 | 7/2018 | Monahan et al. | |
| 2003/0063123 A1 | 4/2003 | Fukube et al. | |
| 2004/0140437 A1 | 7/2004 | Bukofsky et al. | |
| 2004/0256556 A1 | 12/2004 | Winkler et al. | |
| 2013/0112893 A1* | 5/2013 | Miyake | H01J 37/28 |
| | | | 250/306 |
| 2018/0335396 A1* | 11/2018 | Nagano | H01J 37/28 |

FOREIGN PATENT DOCUMENTS

| | | |
|---|---|---|
| JP | 2000067797 A | 3/2000 |
| JP | 2004095459 A | 3/2004 |
| JP | 2011007553 A | 1/2011 |
| JP | 2011227772 A | 11/2011 |
| JP | 2012-022904 A | 2/2012 |
| JP | WO2011148975 A1 | 7/2013 |
| JP | 2018-195514 A | 12/2018 |
| JP | 2019-125416 A | 7/2019 |
| JP | 2020119682 A | 8/2020 |
| TW | 201035536 A | 10/2010 |
| TW | 201732305 A | 9/2017 |

OTHER PUBLICATIONS

Notice of Reasons for Rejection issued in related Japanese Patent Application No. 2022-508482; mailed Mar. 1, 2023 (6 pgs.).

International Search Report and Written Opinion issued by the International Searching Authority in related International Application No. PCT/EP2020/073446, mailed Oct. 30, 2020 (11 pgs.).

Office Action issued by the Intellectual Property Office (IPO) in related ROC (Taiwan) Patent Application No. 109129262, issued May 31, 2021 (12 pgs.).

Office Action issued by the Intellectual Property Office (IPO) in related ROC (Taiwan) Patent Application No. 109129262, issued Nov. 19, 2021 (12 pgs.).

* cited by examiner

100

300

Receive records of performance metric for beams of multi-beam system in imaging process ⎯ 302

Determine whether abnormality of beam occurs based on baseline value determined using portion of records ⎯ 304

Provide abnormality indication in response to determination that abnormality has occurred ⎯ 306

400

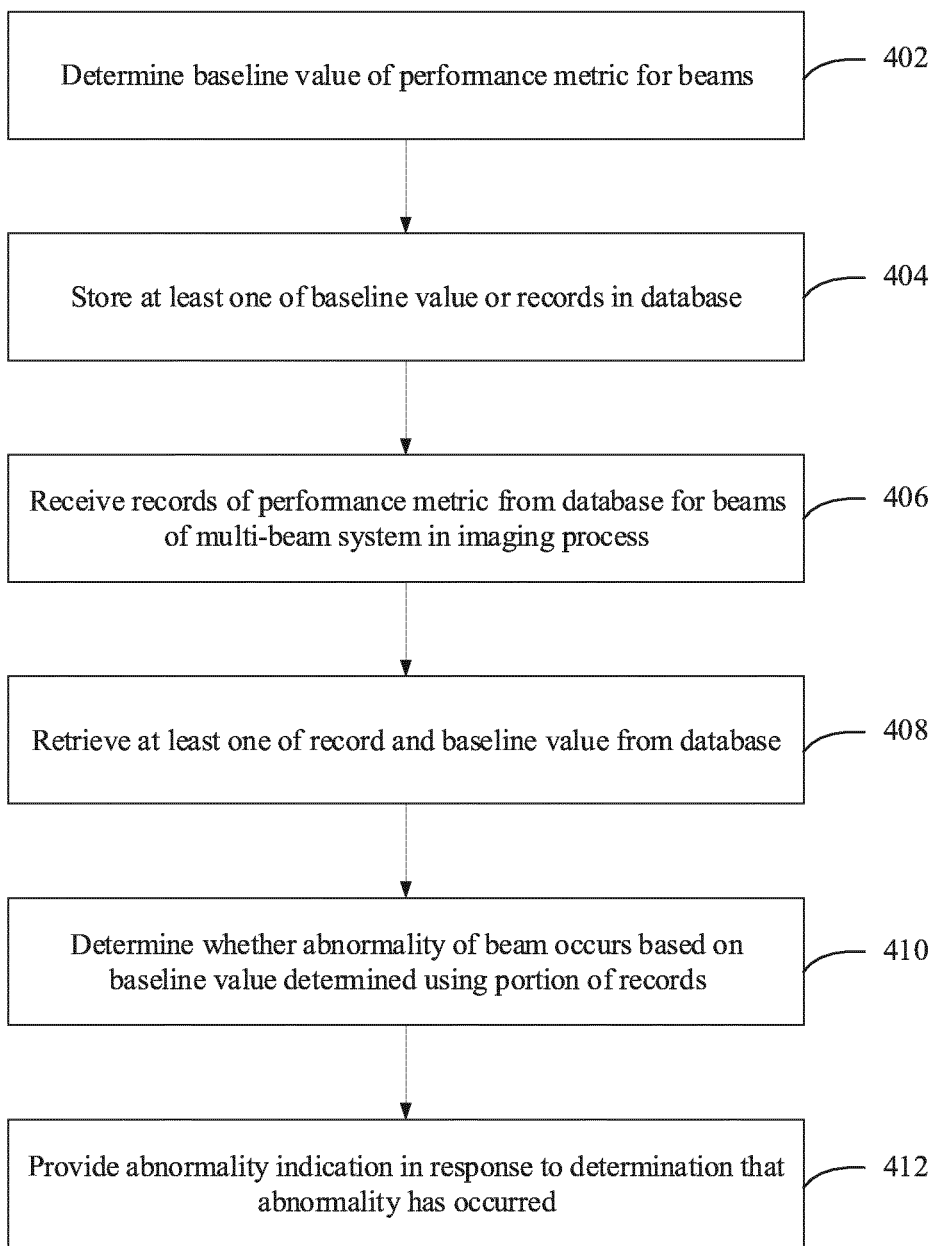

Determine baseline value of performance metric for beams — 402

Store at least one of baseline value or records in database — 404

Receive records of performance metric from database for beams of multi-beam system in imaging process — 406

Retrieve at least one of record and baseline value from database — 408

Determine whether abnormality of beam occurs based on baseline value determined using portion of records — 410

Provide abnormality indication in response to determination that abnormality has occurred — 412

FIG. 4

SELF-REFERENCING HEALTH MONITORING SYSTEM FOR MULTI-BEAM SEM TOOLS

CROSS-REFERENCE TO RELATED APPLICATIONS

This application claims priority to International Application No. PCT/EP2020/073446, filed Aug. 20, 2020, and published as WO 2021/037696 A1, which claims priority of U.S. application 62/893,139 which was filed on Aug. 28, 2019. The contents of these applications are incorporated herein by reference in their entireties.

FIELD

The description herein relates to the field of charged particle beam system, and more particularly to health monitoring for multi-beam scanning electron microscopy (SEM) system.

BACKGROUND

In manufacturing processes of integrated circuits (ICs), unfinished or finished circuit components are inspected to ensure that they are manufactured according to design and are free of defects. Inspection systems utilizing optical microscopes or charged particle (e.g., electron) beam microscopes, such as a scanning electron microscope (SEM) can be employed. SEM delivers low energy electrons (e.g., <1 keV) to a surface and records secondary or backscattered electrons leaving the surface using a detector. By recording such electrons for different excitation positions on the surface, an image can be created with a spatial resolution in the order of nanometers.

The SEM may be a single-beam system or a multi-beam system. A single-beam SEM uses a single electron beam to scan the surface, while a multi-beam SEM uses multiple electron beams to scan the surface simultaneously. The multi-beam system may achieve a higher throughput of imaging compared with the single-beam system. However, the multi-beam system also has more complicated structures, due to which it lacks some structural flexibility compared with the single-beam system. Also, due to its higher complexity, the multi-beam SEM is more prone to operational errors and problems compared with the single-beam SEM.

SUMMARY

Embodiments of the present disclosure provide systems and methods for image enhancement. In some embodiments, a method for monitoring performance of a multi-beam system may include receiving records of a performance metric for beams of the multi-beam system in an imaging process, each record associated with a beam. The method may also include determining whether an abnormality of a beam occurs based on a baseline value determined using a portion of the records. The method may further include providing an abnormality indication in response to the determination that the abnormality has occurred.

In some embodiments, a system for monitoring performance of a multi-beam system is disclosed. The system may include a controller having a circuitry to execute a set of instructions. The controller may execute the set of instructions to cause the system to receive records of a performance metric for beams of the multi-beam system in an imaging process, each record associated with a beam. The controller may also execute the set of instructions to cause the system to determine whether an abnormality of a beam occurs based on a baseline value determined using a portion of the records. The controller may also execute the set of instructions to cause the system to provide an abnormality indication in response to the determination that the abnormality has occurred.

In some embodiments, a non-transitory computer readable medium is disclosed. The non-transitory computer readable medium may store a set of instructions that is executable by at least one processor of an apparatus to cause the apparatus to perform a method for monitoring performance of a multi-beam system. The method may include receiving records of a performance metric for beams of the multi-beam system in an imaging process, each record associated with a beam. The method may also include determining whether an abnormality of a beam occurs based on a baseline value determined using a portion of the records. The method may further include providing an abnormality indication in response to the determination that the abnormality has occurred.

In some embodiments, a method of monitoring health of a multi-beam system may include receiving records of a performance metric for beams of the multi-beam system in an imaging process. The method may also include comparing the records to determine whether a beam of the beams exhibits an abnormality. The method may further include triggering a notification when the beam exhibits the abnormality.

In some embodiments, an apparatus for monitoring health of a multi-beam system is disclosed. The apparatus may include a controller having a circuitry to execute a set of instructions. The controller may execute the set of instructions to cause the system to receive records of a performance metric for beams of the multi-beam system in an imaging process. The controller may also execute the set of instructions to cause the system to compare the records to determine whether a beam of the beams exhibits an abnormality. The controller may further execute the set of instructions to cause the system to trigger a notification when the beam exhibits the abnormality.

In some embodiments, a non-transitory computer readable medium is disclosed. The non-transitory computer readable medium may store a set of instructions that is executable by at least one processor of an apparatus to cause the apparatus to perform a method of monitoring health of a multi-beam system. The method may include receiving records of a performance metric for beams of the multi-beam system in an imaging process. The method may also include comparing the records to determine whether a beam of the beams exhibits an abnormality. The method may further include triggering a notification when the beam exhibits the abnormality.

In some embodiments, a method of monitoring health of a multi-beam system may include receiving records of a performance metric for a plurality of beams of a multi-beam system, the plurality of beams including a first beam and other beams. The method may also include comparing data derived from the records to determine if whether the first beam exhibits abnormal performance as compared to the other beams. The method may further include triggering a notification when a determination is made, based on the comparison, that the first beam exhibits the abnormal performance.

BRIEF DESCRIPTION OF THE DRAWINGS

FIG. 4 is a flowchart illustrating another exemplary method for monitoring performance of a multi-beam system, consistent with embodiments of the present disclosure.

DETAILED DESCRIPTION

Figure 1:
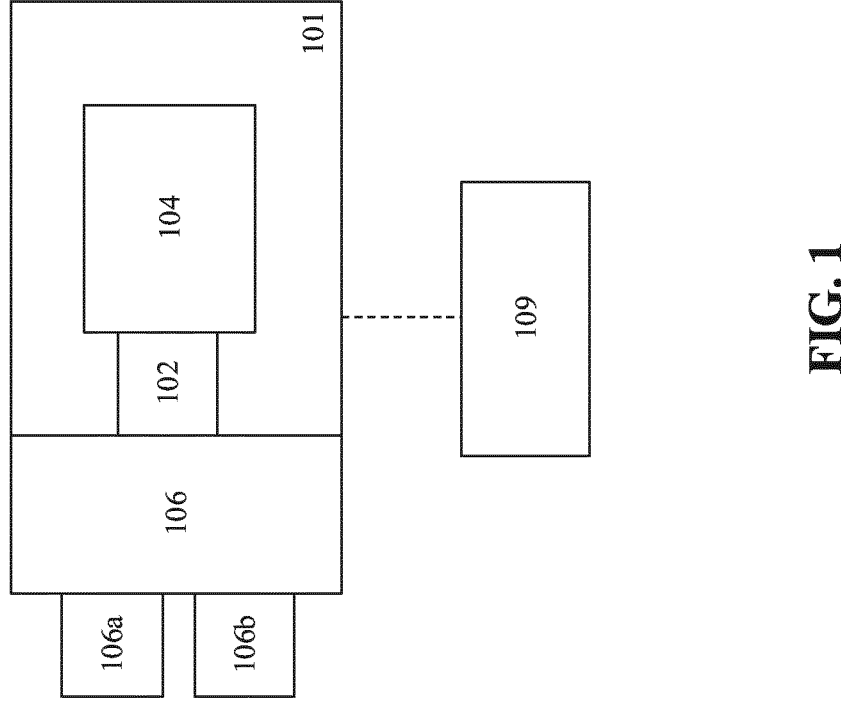
FIG. 1 is a schematic diagram illustrating an exemplary electron beam inspection (EBI) system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of apparatuses and methods consistent with aspects related to the subject matter recited in the appended claims. For example, although some embodiments are described in the context of utilizing electron beams, the disclosure is not so limited. Other types of charged particle beams may be similarly applied. Furthermore, other imaging systems may be used, such as optical imaging, photodetection, x-ray detection, or the like.

Electronic devices are constructed of circuits formed on a piece of silicon called a substrate. Many circuits may be formed together on the same piece of silicon and are called integrated circuits or ICs. The size of these circuits has decreased dramatically so that many more of them can fit on the substrate. For example, an IC chip in a smart phone can be as small as a thumbnail and yet may include over 2 billion transistors, the size of each transistor being less than 1/1000th the size of a human hair.

Making these extremely small ICs is a complex, time-consuming, and expensive process, often involving hundreds of individual steps. Errors in even one step have the potential to result in defects in the finished IC rendering it useless. Thus, one goal of the manufacturing process is to avoid such defects to maximize the number of functional ICs made in the process, that is, to improve the overall yield of the process.

One component of improving yield is monitoring the chip making process to ensure that it is producing a sufficient number of functional integrated circuits. One way to monitor the process is to inspect the chip circuit structures at various stages of their formation. Inspection can be carried out using a scanning electron microscope (SEM). A SEM can be used to image these extremely small structures, in effect, taking a "picture" of the structures of the wafer. The image can be used to determine if the structure was formed properly and also if it was formed in the proper location. If the structure is defective, then the process can be adjusted so the defect is less likely to recur.

The working principle of a SEM is similar to a camera. A camera takes a picture by receiving and recording brightness and colors of light reflected or emitted from people or objects. A SEM takes a "picture" by receiving and recording energies or quantities of electrons reflected or emitted from the structures. Before taking such a "picture," an electron beam may be provided onto the structures, and when the electrons are reflected or emitted ("exiting") from the structures, a detector of the SEM may receive and record the energies or quantities of those electrons to generate an image. To take such a "picture," some SEMs use a single electron beam (referred to as a "single-beam SEM"), while some SEMs use multiple electron beams (referred to as a "multi-beam SEM") to take multiple "pictures" of the wafer. By using multiple electron beams, the SEM may provide more electron beams onto the structures for obtaining these multiple "pictures," resulting in more electrons exiting from the structures. Accordingly, the detector may receive more exiting electrons simultaneously, and generate images of the structures of the wafer with a higher efficiency and a faster speed.

However, compared with a single-beam SEM, a multi-beam SEM includes more components, has a more complex design, and provides a less obvious signal on its electron detector or detectors. The health of the multi-beam SEM is important to monitor because, during operations, even if only one beam works abnormally, the overall performance of the multi-beam SEM may be greatly affected. In addition, when a performance issue occurs, the multi-beam SEM takes more time, costs, and labor for technicians to diagnose due to its more complex design. Nevertheless, due to its less than obvious signal, the health monitoring of the multi-beam SEM is more difficult than that of the single-beam SEM.

This disclosure describes, among others, methods and systems for multi-beam SEM health monitoring. In some embodiments, to monitor the health, a "baseline" condition may be used as a gauge of performance data of the multi-beam SEM. Operating parameters or statistics of performance data of the multi-beam SEM may be collected and compared with the baseline condition. If abnormalities of the operating parameters or statistics occurs based on the comparison, abnormality of the performance of the multi-beam SEM may be reported, and further actions may be taken. In an example, a multi-beam SEM may use a self-referencing scheme, which may utilize historical performance data of the multi-beam SEM to determine a history-based baseline condition or utilize individual performance data of each beam to determine a group-performance-based baseline condition. The history-based baseline condition or the group-performance-based baseline condition are used as a reference to monitor health of the multi-beam SEM. Essentially, by using the history-based baseline condition, the current performance of a beam of the multi-beam SEM is compared with the previous ("historical") performance of the same beam measured at an earlier time while the multi-beam system is operating, and an abnormality is identified if the current performance outlie the historical performance. By using the group-performance-based baseline, the current performance of a beam of the multi-beam SEM is compared with the current performance of other beams measured while the multi-beam system is operating, and an abnormality is identified if the current performance of the beam outlie the current performances of the other beams.

By using the self-referencing scheme, the health of the multi-beam SEM may be continuously monitored without referencing external input, self-adapting to changed operating conditions, and automatically identifying abnormalities with higher accuracy. As can be seen, the accuracy and effectiveness of the baseline condition are important in the health monitoring for multi-beam SEM. If external input is relied on to provide such a baseline condition, the health monitoring may need updates of the external input when the operating conditions of the multi-beam SEM change, and it would cause difficulties in continuous monitoring the health, self-adapting to the change of the operating conditions, and automatic identification of abnormalities with high accuracy.

Relative dimensions of components in drawings may be exaggerated for clarity. Within the following description of drawings, the same or like reference numbers refer to the same or like components or entities, and only the differences with respect to the individual embodiments are described.

As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

FIG. 1 illustrates an exemplary electron beam inspection (EBI) system 100 consistent with embodiments of the present disclosure. EBI system 100 may be used for imaging. As shown in FIG. 1, EBI system 100 includes a main chamber 101, a load/lock chamber 102, an electron beam tool 104, and an equipment front end module (EFEM) 106. Electron beam tool 104 is located within main chamber 101. EFEM 106 includes a first loading port 106a and a second loading port 106b. EFEM 106 may include additional loading port (s). First loading port 106a and second loading port 106b receive wafer front opening unified pods (FOUPs) that contain wafers (e.g., semiconductor wafers or wafers made of other material(s)) or samples to be inspected (wafers and samples may be used interchangeably). A "lot" is a plurality of wafers that may be loaded for processing as a batch.

One or more robotic arms (not shown) in EFEM 106 may transport the wafers to load/lock chamber 102. Load/lock chamber 102 is connected to a load/lock vacuum pump system (not shown) which removes gas molecules in load/lock chamber 102 to reach a first pressure below the atmospheric pressure. After reaching the first pressure, one or more robotic arms (not shown) may transport the wafer from load/lock chamber 102 to main chamber 101. Main chamber 101 is connected to a main chamber vacuum pump system (not shown) which removes gas molecules in main chamber 101 to reach a second pressure below the first pressure. After reaching the second pressure, the wafer is subject to inspection by electron beam tool 104. Electron beam tool 104 may be a single-beam system or a multi-beam system.

A controller 109 is electronically connected to electron beam tool 104. Controller 109 may be a computer configured to execute various controls of EBI system 100. While controller 109 is shown in FIG. 1 as being outside of the structure that includes main chamber 101, load/lock chamber 102, and EFEM 106, it is appreciated that controller 109 may be a part of the structure.

In some embodiments, controller 109 may include one or more processors (not shown). A processor may be a generic or specific electronic device capable of manipulating or processing information. For example, the processor may include any combination of any number of a central processing unit (or "CPU"), a graphics processing unit (or "GPU"), an optical processor, a programmable logic controllers, a microcontroller, a microprocessor, a digital signal processor, an intellectual property (IP) core, a Programmable Logic Array (PLA), a Programmable Array Logic (PAL), a Generic Array Logic (GAL), a Complex Programmable Logic Device (CPLD), a Field-Programmable Gate Array (FPGA), a System On Chip (SoC), an Application-Specific Integrated Circuit (ASIC), and any type circuit capable of data processing. The processor may also be a virtual processor that includes one or more processors distributed across multiple machines or devices coupled via a network.

In some embodiments, controller 109 may further include one or more memories (not shown). A memory may be a generic or specific electronic device capable of storing codes and data accessible by the processor (e.g., via a bus). For example, the memory may include any combination of any number of a random-access memory (RAM), a read-only memory (ROM), an optical disc, a magnetic disk, a hard drive, a solid-state drive, a flash drive, a security digital (SD) card, a memory stick, a compact flash (CF) card, or any type of storage device. The codes may include an operating system (OS) and one or more application programs (or "apps") for specific tasks. The memory may also be a virtual memory that includes one or more memories distributed across multiple machines or devices coupled via a network.

Figure 2:
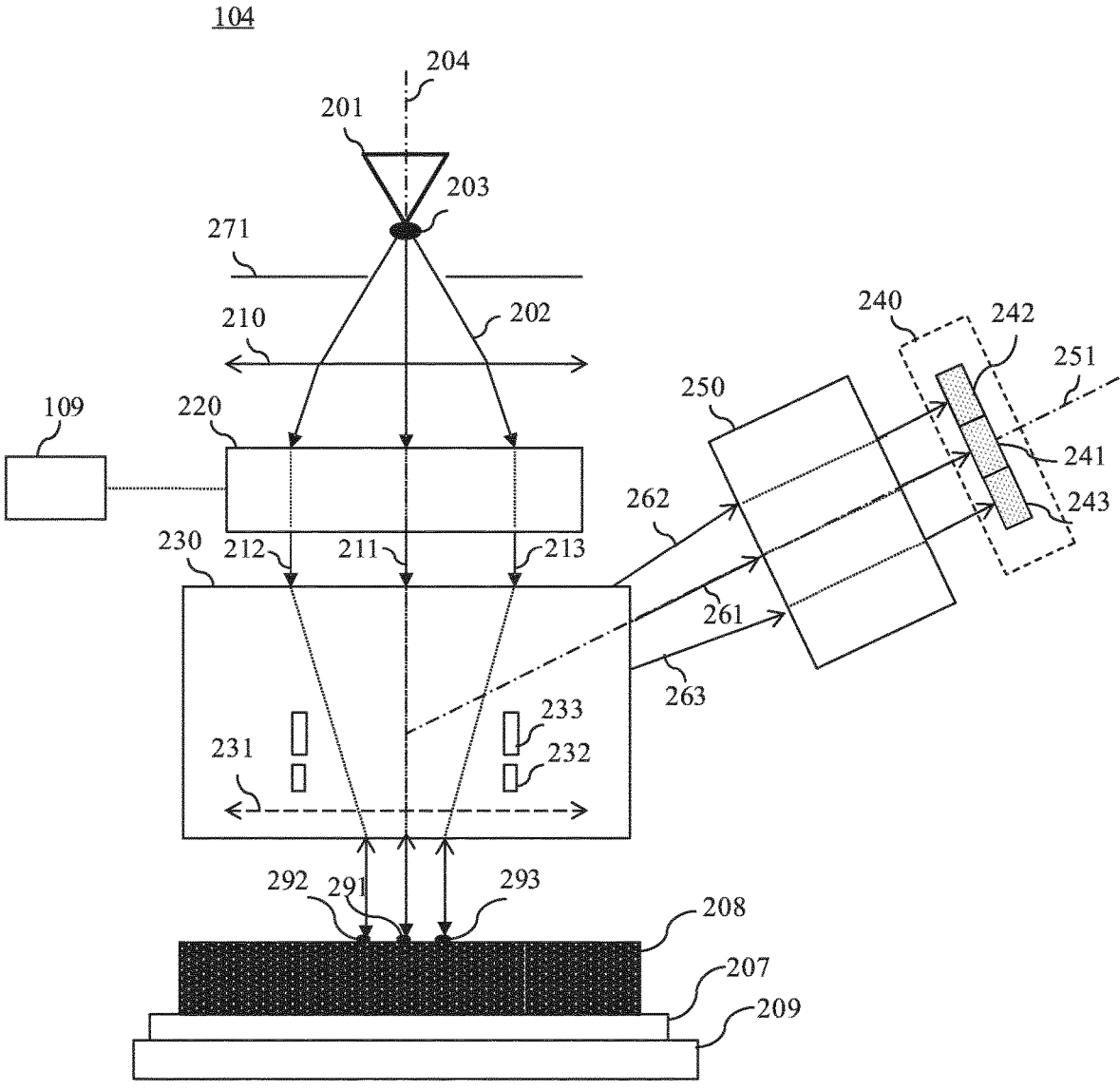
FIG. 2 is a schematic diagram illustrating an exemplary multi-beam system that is part of the exemplary charged particle beam inspection system of FIG. 1, consistent with embodiments of the present disclosure.

Reference is now made to FIG. 2, which is a schematic diagram illustrating an exemplary electron beam tool 104 including a multi-beam inspection tool that is part of the EBI system 100 of FIG. 1, consistent with embodiments of the present disclosure. Multi-beam electron beam tool 104 (also referred to herein as apparatus 104) comprises an electron source 201, a gun aperture plate 271, a condenser lens 210, a source conversion unit 220, a primary projection system 230, a motorized stage 209, and a sample holder 207 supported by motorized stage 209 to hold a sample 208 (e.g., a wafer or a photomask) to be inspected. Multi-beam electron beam tool 104 may further comprise a secondary projection system 250 and an electron detection device 240. Primary projection system 230 may comprise an objective lens 231. Electron detection device 240 may comprise a plurality of detection elements 241, 242, and 243. A beam separator 233 and a deflection scanning unit 232 may be positioned inside primary projection system 230.

Electron source 201, gun aperture plate 271, condenser lens 210, source conversion unit 220, beam separator 233, deflection scanning unit 232, and primary projection system 230 may be aligned with a primary optical axis 204 of apparatus 104. Secondary projection system 250 and electron detection device 240 may be aligned with a secondary optical axis 251 of apparatus 104.

Electron source 201 may comprise a cathode (not shown) and an extractor or anode (not shown), in which, during operation, electron source 201 is configured to emit primary electrons from the cathode and the primary electrons are extracted or accelerated by the extractor and/or the anode to form a primary electron beam 202 that form a primary beam crossover (virtual or real) 203. Primary electron beam 202 may be visualized as being emitted from primary beam crossover 203.

Source conversion unit 220 may comprise an image-forming element array (not shown), an aberration compensator array (not shown), a beam-limit aperture array (not shown), and a pre-bending micro-deflector array (not shown). In some embodiments, the pre-bending micro-deflector array deflects a plurality of primary beamlets 211, 212, 213 of primary electron beam 202 to normally enter the beam-limit aperture array, the image-forming element array, and an aberration compensator array. In some embodiment, condenser lens 210 is designed to focus primary electron beam 202 to become a parallel beam and be normally incident onto source conversion unit 220. The image-forming element array may comprise a plurality of micro-deflectors or micro-lenses to influence the plurality of primary beamlets 211, 212, 213 of primary electron beam 202 and to form a plurality of parallel images (virtual or real) of primary beam crossover 203, one for each of the primary beamlets 211, 212, and 213. In some embodiments, the aberration compensator array may comprise a field curvature compensator array (not shown) and an astigmatism compensator array (not shown). The field curvature compensator array may comprise a plurality of micro-lenses to compensate field curvature aberrations of the primary beamlets 211, 212, and 213. The astigmatism compensator array may comprise a plurality of micro-stigmators to compensate astigmatism aberrations of the primary beamlets 211, 212, and 213. The beam-limit aperture array may be configured to limit diameters of individual primary beamlets 211, 212, and 213. FIG. 2 shows three primary beamlets 211, 212, and 213 as an example, and it is appreciated that source conversion unit 220 may be configured to form any number of primary beamlets. Controller 109 may be connected to various parts of EBI system 100 of FIG. 1, such as source conversion unit 220, electron detection device 240, primary projection system 230, or motorized stage 209. In some embodiments, as explained in further details below, controller 109 may perform various image and signal processing functions. Controller 109 may also generate various control signals to govern operations of the charged particle beam inspection system.

Condenser lens 210 is configured to focus primary electron beam 202. Condenser lens 210 may further be configured to adjust electric currents of primary beamlets 211, 212, and 213 downstream of source conversion unit 220 by varying the focusing power of condenser lens 210. Alternatively, the electric currents may be changed by altering the radial sizes of beam-limit apertures within the beam-limit aperture array corresponding to the individual primary beamlets. The electric currents may be changed by both altering the radial sizes of beam-limit apertures and the focusing power of condenser lens 210. Condenser lens 210 may be a movable condenser lens that may be configured so that the position of its first principle plane is movable. The movable condenser lens may be configured to be magnetic, which may result in off-axis beamlets 212 and 213 illuminating source conversion unit 220 with rotation angles. The rotation angles change with the focusing power or the position of the first principal plane of the movable condenser lens. Condenser lens 210 may be an anti-rotation condenser lens that may be configured to keep the rotation angles unchanged while the focusing power of condenser lens 210 is changed. In some embodiments, condenser lens 210 may be a movable anti-rotation condenser lens, in which the rotation angles do not change when its focusing power and the position of its first principal plane are varied.

Objective lens 231 may be configured to focus beamlets 211, 212, and 213 onto a sample 208 for inspection and may form, in the current embodiments, three probe spots 221, 222, and 223 on the surface of sample 208. Gun aperture plate 271, in operation, is configured to block off peripheral electrons of primary electron beam 202 to reduce Coulomb effect. The Coulomb effect may enlarge the size of each of probe spots 221, 222, and 223 of primary beamlets 211, 212, 213, and therefore deteriorate inspection resolution.

Beam separator 233 may, for example, be a Wien filter comprising an electrostatic deflector generating an electrostatic dipole field and a magnetic dipole field (not shown in FIG. 2). In operation, beam separator 233 may be configured to exert an electrostatic force by electrostatic dipole field on individual electrons of primary beamlets 211, 212, and 213. The electrostatic force is equal in magnitude but opposite in direction to the magnetic force exerted by magnetic dipole field of beam separator 233 on the individual electrons. Primary beamlets 211, 212, and 213 may therefore pass at least substantially straight through beam separator 233 with at least substantially zero deflection angles.

Deflection scanning unit 232, in operation, is configured to deflect primary beamlets 211, 212, and 213 to scan probe spots 221, 222, and 223 across individual scanning areas in a section of the surface of sample 208. In response to incidence of primary beamlets 211, 212, and 213 or probe spots 221, 222, and 223 on sample 208, electrons emerge from sample 208 and generate three secondary electron beams 261, 262, and 263. Each of secondary electron beams 261, 262, and 263 typically comprise secondary electrons (having electron energy≤50 eV) and backscattered electrons (having electron energy between 50 eV and the landing energy of primary beamlets 211, 212, and 213). Beam separator 233 is configured to deflect secondary electron beams 261, 262, and 263 towards secondary projection system 250. Secondary projection system 250 subsequently focuses secondary electron beams 261, 262, and 263 onto detection elements 241, 242, and 243 of electron detection device 240. Detection elements 241, 242, and 243 are arranged to detect corresponding secondary electron beams 261, 262, and 263 and generate corresponding signals which are sent to controller 109 or a signal processing system (not shown), e.g., to construct images of the corresponding scanned areas of sample 208.

In some embodiments, detection elements 241, 242, and 243 detect corresponding secondary electron beams 261, 262, and 263, respectively, and generate corresponding intensity signal outputs (not shown) to an image processing system (e.g., controller 109). In some embodiments, each detection element 241, 242, and 243 may comprise one or more pixels. The intensity signal output of a detection element may be a sum of signals generated by all the pixels within the detection element.

In some embodiments, controller 109 may comprise image processing system that includes an image acquirer (not shown), a storage (not shown). The image acquirer may comprise one or more processors. For example, the image acquirer may comprise a computer, server, mainframe host, terminals, personal computer, any kind of mobile computing devices, and the like, or a combination thereof. The image acquirer may be communicatively coupled to electron detection device 240 of apparatus 104 through a medium such as an electrical conductor, optical fiber cable, portable storage media, IR, Bluetooth, internet, wireless network, wireless radio, among others, or a combination thereof. In some embodiments, the image acquirer may receive a signal from electron detection device 240 and may construct an image. The image acquirer may thus acquire images of sample 208. The image acquirer may also perform various post-processing functions, such as generating contours, superimposing indicators on an acquired image, and the like. The image acquirer may be configured to perform adjustments of brightness and contrast, etc. of acquired images. In some embodiments, the storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

In some embodiments, the image acquirer may acquire one or more images of a sample based on an imaging signal received from electron detection device 240. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of sample 208. The acquired images may comprise multiple images of a single imaging area of sample 208 sampled multiple times over a time sequence. The multiple images may be stored in the storage. In some embodiments, controller 109 may be configured to perform image processing steps with the multiple images of the same location of sample 208.

In some embodiments, controller 109 may include measurement circuitries (e.g., analog-to-digital converters) to obtain a distribution of the detected secondary electrons. The electron distribution data collected during a detection time window, in combination with corresponding scan path data of each of primary beamlets 211, 212, and 213 incident on the wafer surface, can be used to reconstruct images of the wafer structures under inspection. The reconstructed images can be used to reveal various features of the internal or external structures of sample 208, and thereby can be used to reveal any defects that may exist in the wafer.

In some embodiments, controller 109 may control motorized stage 209 to move sample 208 during inspection of sample 208. In some embodiments, controller 109 may enable motorized stage 209 to move sample 208 in a direction continuously at a constant speed. In other embodiments, controller 109 may enable motorized stage 209 to change the speed of the movement of sample 208 overtime depending on the steps of scanning process.

Although FIG. 2 shows that apparatus 104 uses three primary electron beams, it is appreciated that apparatus 104 may use two or more number of primary electron beams. The present disclosure does not limit the number of primary electron beams used in apparatus 104.

Compared with a SEM inspection tool that uses a single electron beam (referred to as a "single-beam system"), a multi-beam SEM inspection tool ("multi-beam system") may use multiple electron beams to simultaneously image a sample (e.g., sample 208 in FIG. 2). Throughput of the multi-beam inspection tool may be higher than the single-beam system. However, due to its high complexity, the multi-beam system may lack some structural flexibilities by the single-beam system. Further, the signal-to-noise ratio (SNR) of the signals of the multi-beam system may be lower than the signals of the single-beam system, which may cause difficulty in monitoring its health. For example, the brightness of the SEM images generated by the multi-beam system may have an accumulated drift. If such a drift is not identified, it may be propagated into image analysis and cause errors. Therefore, it is important to monitor the health of the multi-beam system and provide it with a precise and timely diagnosis, which may decrease manpower and costs of maintenance, as well as cycle time.

In some embodiments of this disclosure, a self-referencing scheme may be used to monitor the health of the multi-beam system. The self-referencing scheme may utilize a baseline condition or a group performance metric as a reference to monitor performance metrics of the beams. The performance metrics may be indicative of at least one of image quality or geometric distortion of an image generated in an imaging process from a field of view (FOV) of a beam. The performance metrics may indicate performances of the imaging of the beams. The baseline condition may be a fixed benchmark, behavior, or specification of the performance metrics. The baseline condition may depend on various conditions, such as landing energy of a beam, a current of the beam, a pixel size of the sample, or specifications of the sample.

In some embodiments, the multi-beam system may select one or more performance metrics of multiple beams of the multi-beam system to record. The multi-beam system may record performance metrics of multiple beams and determine the baseline condition therefrom. Such a baseline condition may be unavailable in the single-beam system. In some embodiments, the multi-beam system may start recording the values at a predetermined time point.

In some embodiments, the multi-beam system may determine whether an abnormality occurs to a beam based on a comparison between a performance metric of the beam and the baseline condition. In some embodiments, the multi-beam system may determine whether the abnormality occurs to the beam based on a comparison between the performance metric of the beam and a group performance metric of the multiple beams. By using various performance metrics in the self-referencing scheme, an abnormality may be quickly diagnosed for follow-up analysis of root cause, and thus, the efficiency of troubleshooting may be increased.

In some embodiments, the multi-beam system may perform the aforementioned processes in an automated fashion. By doing so, the multi-beam system may be able to continuously monitor the health of the multi-beam system, detect an abnormality, and diagnose one or more problem-causing modules (e.g., a hardware module or a software module) based on the detected abnormality.

Figure 3:
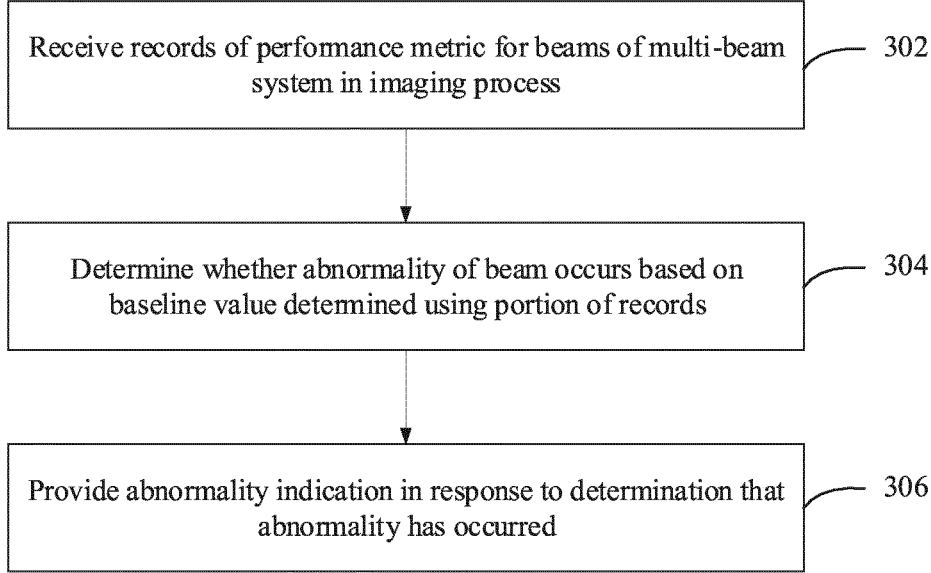
FIG. 3 is a flowchart illustrating an exemplary method for monitoring performance of a multi-beam system, consistent with embodiments of the present disclosure.

FIGS. 3-4 show example flowcharts illustrating methods 300-400 that are consistent with embodiments of this disclosure. Methods 300-400 may be performed by a monitor module that may be coupled with a charged particle beam apparatus (e.g., EBI system 100). For example, a controller (e.g., controller 109 in FIGS. 1-2) may include the monitor module and may be programmed to implement methods 300-400.

FIG. 3 is a flowchart illustrating an exemplary method for monitoring performance of a multi-beam system, consistent with embodiments of the present disclosure.

At step 302, a controller (e.g., controller 109 in FIGS. 1-2) receives records of a performance metric for beams of the multi-beam system in an imaging process. In some embodiments, the controller may receive the records from a database coupled with the charged particle beam apparatus (e.g., EBI system 100). For example, the database may receive operating data of the multi-beam system and preprocess it to be the records of the performance metric for the beams. In some embodiments, each record may be associated with a beam. The imaging process may be a process of generating SEM images by scanning the beams across a surface of a sample (e.g., sample 208 in FIG. 2). In some embodiments, the controller may receive records for multiple performance metrics. In some embodiments, the controller may store the records of the performance metric in a database, such as a database in a memory accessible by the controller.

In some embodiments, the performance metric may include any variable or parameter that is indicative of at least one of image quality or geometric distortion of an image generated in the imaging process from a field of view (FOV)

of a beam of the beams. For example, for each beam, the controller may control to generate a SEM image (e.g., by using electron detection device 240 in FIG. 2) for the FOV of the beam. In some embodiments, the performance metric indicative of the geometric distortion of the image may include a variable or parameter that indicates or characterizes an aberration, a structural distortion, or a change of a geometric shape. In some embodiments, the performance metric indicative of the image quality may include a variable or parameter that indicates, characterizes, or represents a noise level of the image, a brightness of the image, a contrast of the image, sharpness of the image, or a resolution of the image.

For example, when the performance metric includes a variable or parameter that indicates, characterizes, or represents a noise level of the image, the data indicating or characterizing noise level ("noise level data") of the image may be generated or derived from one or more signals ("background signals") received by electron detection device 240 from a region ("background region") that has no pattern of designed circuits. In some embodiments, the controller may determine the noise level data of the image using a portion of the image corresponding to a background region of the FOV. For example, the FOV may cover a region that has patterns of a designed circuit and a background region. The controller may then determine signal levels detected by electron detection device 240 corresponding to the background region. In some embodiments, the controller may determine the region based on at least one of layout data of the region of the FOV or image data of the image. For example, the design data may include files of a Graphic Database System (GDS) format, a Graphic Database System II (GDS II) format, an Open Artwork System Interchange Standard (OASIS) format, a Caltech Intermediate Format (CIF), etc., which indicate distributions of patterns of a designed circuit. The design data may include information indicating whether a region has patterns or not. For another example, the background region may be determined by analyzing the image of the FOV, such as by performing feature extraction to the image. Regions that have no features extracted after the feature extraction may be determined as background regions, for example.

For another example, when the performance metric includes a variable or parameter that indicates, characterizes, or represents the brightness or the contrast of the image, the controller may determine at least one of the brightness or the contrast based on a gray level of the image. For example, the image of the FOV may be a grayscale SEM image. By analyzing grayscale values of pixels of the image, the controller may determine the brightness, the contrast, or both.

For another example, when the performance metric includes a variable or parameter that indicates, characterizes, or represents the resolution or the sharpness, the resolution or the sharpness may be used to determine whether a beam is out of focus. In some embodiments, the controller may determine at least one of the sharpness or the resolution from a step profile. Before doing so, the controller may extract the step profile from a pattern edge of the image. The pattern edge may be an edge of a pattern in the image. For example, the controller may perform the aforementioned feature extraction to the grayscale image of the FOV to extract patterns. The controller may determine an edge from the patterns. The edge may correspond to a feature of the circuit that has a wall structure, such as a ditch, a groove, a hole, a line, or a step. Ideally, the edge may have a 90° wall between two surfaces of different heights, and grayscale values corresponding to the edge in the image may have a non-continuous jump. However, due to actual lithography and etching process in manufacturing and uncertainties in SEM imaging, the edge may not have a 90° wall, and the grayscale values corresponding to it may have a continuous change, referred to as a "step profile." In some embodiments, the controller may determine a rate of change for grayscale values of the step profile, wherein the larger the rate of change, the higher the sharpness or the resolution may be.

Referring back to FIG. 3, at step 304, the controller determines whether an abnormality of a beam occurs based on a parameter value determined using a portion of the records. The parameter value may be a history-based baseline value or a group-performance-based baseline value. During a current operating period of the multi-beam SEM in which the parameter value is the history-based baseline value, the controller may determine the parameter value using performance data of a previous operating period of the multi-beam SEM, such as an "initial period" or "test run" period during when the multi-beam SEM operates immediately after maintenance or calibration. During a current operating period of the multi-beam SEM in which the parameter value is the group-performance-based baseline value, the controller may determine the parameter value using performance data of the current operating period of the multi-beam SEM.

In some embodiments, for determining whether the abnormality of the beam occurs, the controller may determine the parameter value as a history-based baseline value of the performance metric for the beams based on historical values of the record. In some embodiments, the controller may determine the baseline value after a predetermined event. For example, the controller may determine the baseline value based on initial records of the performance metric received after the predetermined event. In some embodiments, the predetermined event may include completion of one of maintenance of the multi-beam system or calibration of the multi-beam system. For example, after completion of maintenance or calibration, the multi-beam system may be run again and record values of the performance metric for each beam of the beams. Such values may be used as references for the performance metric and may be referred to as the "initial records." In some embodiments, the predetermined event may include that each value of the records changes by a shift value, and the shift value does not deviate from an average value of the values of the records exceeding a predetermined range. For example, after the maintenance or calibration, for each beam, the controller may store a value of a record corresponding to the beam, and the value may fall within a predetermined tolerance range. The tolerance range may be configured by a user of the multi-beam system, for example. In some embodiments, the controller may also determine a test value of the beam using at least one value of a record of the beam received at multiple time points of the imaging process.

In some embodiments, for determining whether the abnormality of the beam occurs, the controller may determine the parameter value as a group-performance-based baseline value, such as a statistic of the values of the portion of the records. For example, the controller may compare data derived from the records of the beams to determine whether a first beam exhibits abnormal performance as compared to other beams. The controller may determine a statistic of the performance metric for the other beams, and may determine that a difference between the performance metric for the first beam and the statistic is more greater than or equal to a predetermined threshold. The statistic may include, for example, a mean value of the records, a median value of the records, a variance value of the records, a standard deviation value of the records, or a root mean square value of the records. In some embodiments, the portion of the records may be all of the records. In some embodiments, the portion of the records may be a subset of the records. For example, if a multi-beam system has 25 beamlets, the controller may receive values of the records corresponding to the 25 beamlets. The controller may further determine the statistic of the records using a number (e.g., 5, 10, 18, 25, etc.) of the records. The controller may then determine the statistic as the group-performance-based baseline value.

In some embodiments, after determining the parameter value (e.g., the history-based baseline value or the group-performance-based baseline value), the controller may further determine whether a difference between the test value of the record and the baseline value is within a predetermined range. The controller may then determine that the abnormality has occurred based on the determination that the difference is not within the predetermined range. In some embodiments, the controller may store at least one of the parameter value or the records in the database. In some embodiments, the controller may retrieve at least one of the records or the parameter value from the database before determining whether the difference is within the predetermined range.

Figure 5:
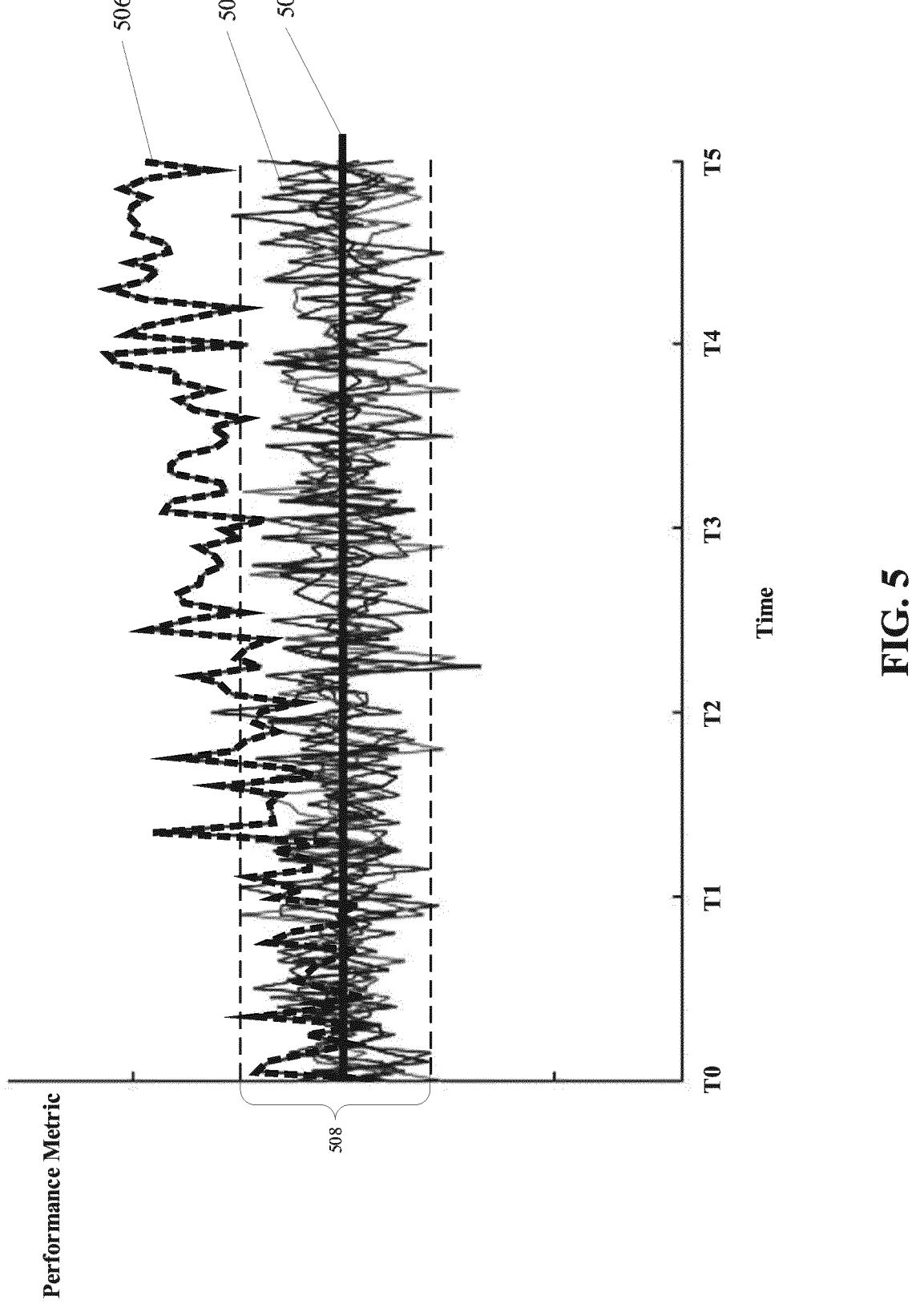
FIG. 5 is an illustration of time-dependent values of a performance metric of beams of the multi-beam system, consistent with embodiments of the present disclosure.

An example baseline value may be shown in FIG. 5. FIG. 5 is an illustration of time-dependent values of a performance metric of beams of the multi-beam system, consistent with embodiments of the present disclosure. In FIG. 5, the horizontal axis represents a timeline (from left to right), and the vertical axis represents values of the performance metric. The timeline includes several time points, including timepoints T0-T5. As the multi-beam system includes multiple beams, FIG. 5 shows multiple curves 502. Each curve of curves 502 may represent time-dependent values of a record, and each record corresponds to a beam of the multi-beam system. Curves 502 includes current curve 506. FIG. 5 also shows a baseline 504 that does not represent time-dependent values. The controller may compare each of curves 502 (including current curve 506) with baseline 504 and determine that an abnormality has occurred to a curve if a difference between the curve and baseline 504 satisfies a predetermined condition. In some embodiments, the predetermined condition may be that the difference is not within a predetermined range. For example, in FIG. 5, the predetermined range is shown as range 508 that includes baseline 504. In some embodiments, the predetermined range may be symmetric about the baseline value. In some embodiments, the predetermined range may be symmetric about the baseline value. In some embodiments, the predetermined range may be asymmetric about the baseline value. Although range 508 is shown as symmetric about baseline 504, it may also be asymmetric.

In some embodiments, the controller may determine baseline 504 as a history-based baseline. For example, the controller may determine baseline 504 using the initial records received before time point T0. Starting at time point T0, the value of baseline 504 may be constant, and the controller may compare each curve of curves 502 (e.g., current curve 506) with baseline 504. If the difference between baseline 504 and the curve is out of range 508, the controller may determine that an abnormality has occurred. For example, in FIG. 5, baseline 504 may be a history-based baseline and have a constant value in time. At a time point between time points T1 and T2, a difference between current curve 506 and baseline 504 exceeds range 508, in which the controller may determine that an abnormality has occurred at a beam corresponding to current curve 506.

In some embodiments, the controller may determine baseline 504 as a group-performance-based baseline. For example, the controller may determine baseline 504 as a statistic of a portion of curves 502. The "statistic" may be a numerical value that is computed from and characterizes a sample of data. For example, the statistic may be a mean value, a median value, a standard deviation, a standard error, or any other numerical value suitable to be used as baseline 504. For example, the portion of curves 502 may be all of the curves 502 (e.g., including current curve 506). For another example, the portion of curves 502 may be all curves 502 except current curve 506. It should be noted that any subset of curves 502 may be the portion of curves 502 used for determining the statistic. In some embodiments, the controller may determine the statistic at a time point. In cases that the controller determines the statistic at a time point, values of baseline curve 504 and range 508 in FIG. 5 may move up and down as time goes by. For ease of explanation without causing ambiguity, when baseline 504 represents a group-performance-based baseline in FIG. 5, it represents the group-performance-based baseline determined at a specific time point.

In some embodiments, the controller may determine baseline 504 as the statistic of the portion of curves 502 at a previous or a current time point. For example, at time point T3, the controller may determine the statistic using real-time values of the portion of curves 502 received at time point T3, T2, T1, T0, or any time point prior to or concurrent to time point T3. In some embodiments, the controller may determine baseline 504 as the statistic of the portion of curves 502 over a time range. For example, at time point T3, the controller may determine the statistic using all values of the portion of curves 5 received within a time range between time points T0 and T1, T1 and T2, T2 and T3, T0 and T2, T1 and T3, or any time range prior to or including up to time point T3.

In some embodiments, the controller may update baseline 504 as the statistic of the portion of curves 502 dynamically (e.g., periodically or in real time). The controller may update baseline 504 using values of the portion of curves 502 at a previous or a current time point or over a time range, as described above. In some embodiments, the controller may update baseline 504 as the statistic of the portion of curves 502 at different time points, either periodically or not periodically. For example, in FIG. 5, as time goes by, the controller may update baseline 504 at any of time points T0, T1, T2, T3, T4, and T5. In some embodiments, the controller may update baseline 504 as the statistic of the portion of curves 502 over a sliding time window. For example, at time point T3, the controller may determine baseline 504 as the statistic of the portion of curves 502 using values of the portion of curves 502 over a time window between time points T1 and T2, T2 and T3, T0 and T1, T0 and T2, T1 and T3, or any time range prior to or including up to time point T3. At time point T4, the controller may determine the baseline 504 as the statistic of the portion of curves 502 using values of the portion of curves 502 over a time window between time points T2 and T3, T3 and T4, T1 and T2, T1 and T3, T2 and T4, or any time range that is prior to or including up to time point T4, shifted by a time difference of (T4−T3), and of the same length as the time window used at time point T3. Other methods for determining and updating baseline 504 may be used and are not limited to the aforementioned examples.

It should be noted that, when comparing current curve 506 and baseline 504, the controller may use either a real-time or instant value of current curve 506 or a statistic of current curve 506. In some embodiments, the controller may use the real-time value of current curve 506 for the comparison, such as a real-time value received at a time point when the comparison is to be performed. For example, at time point T3, the real-time value of current curve 506 may be received at time point T3. When the controller uses the real-time value of current curve 506 for the comparison, the controller may determine that an abnormality occurs when a difference between the real-time value of current curve 506 and baseline 504 satisfies the predetermined condition. For example, in FIG. 5, at a time point between time points T1 and T2, current curve 506 has a real-time value shown as the first spike in timeline that exceeds the upper limit of range 508. At that time point, the controller may determine that an abnormality occurs at the beam corresponding to current curve 506.

In some embodiments, the controller may use a current statistic (e.g., a mean value, a median value, etc.) of current curve 506 for the comparison. The current statistic of current curve 506 may be determined over a time period using all values of current curve 506 received within that time period. The current statistic of current curve 506 may be determined in a fashion similar to the statistic of curves 502. For example, at time point T4, the current statistic of current curve 506 may be a mean of all values of current curve 506 received within a time period between time points T3 and T4. For another example, at time point T5, the current statistic of current curve 506 may be a median value of all values of current curve 506 received within a time period between time points T2 and T5. When the controller uses the current statistic of current curve 506 for the comparison, the controller may determine that an abnormality occurs when a difference between the current statistic of current curve 506 and baseline 504 satisfies the predetermined condition. For example, in FIG. 5, at time point T2, the current statistic may be a mean of all values of current curve 506 received within time period between time points T1 and T2. At a time point between time points T1 and T2, current curve 506 has a real-time value shown as the first spike in timeline that exceeds the upper limit of range 508. However, the current statistic between time points T1 and T2 may fall within range 508, and the controller may not determine that an abnormality occurs at time point T2. Nevertheless, at time point T3, where the current statistic may be a mean of all values of current curve 506 received within time period between time points T2 and T3, the current statistic between time points T2 and T3 may exceed range 508. Accordingly, the controller may determine that an abnormality has occurred to the beam corresponding to current curve 506 at time point T3.

In some embodiments, for determining whether the abnormality of the beam occurs, an ensemble performance method may be used. In the ensemble performance method, the controller may determine a first regression parameter from a regression performed on values of the record received at multiple time points, and second regression parameters from regressions performed on values of each of the portion of the records received at the multiple time points. Each of the second regression parameters may correspond to one portion of the records.

For example, FIG. 5 shows curves 502 and a current curve 506 that is to be determined whether an abnormality exists therein. Current curve 506 corresponds to a record of a beam, from which the controller is detecting whether an abnormality occurs. For example, from time point T0, the controller may control the recording and storing of values of the performance metric corresponding to beams of the multi-beam system, each corresponding to a curve of curves 502. The values may be recorded continuously or intermittently. The first regression parameter may be determined from a regression performed on current curve 506. The second regression parameters may be determined from regressions performed on a subset of curves 502. In some embodiments, the subset may include current curve 506. In some embodiments, the subset may not include current curve 506. For example, the subset may include all of curves 502 except current curve 506. For another example, the subset may include some of curves 502 except current curve 506. Each second regression parameter may correspond to one of the subset of curves 502. In some embodiments, the regression may include linear regression, and the first regression parameter and the second regression parameters may include one of a slope or an intercept. For example, by performing a linear regression on current curve 506, the controller may determine at least one of a first slope or a first intercept for current curve 506. By performing the linear regression on each of the subset of curves 502, the controller may determine at least one of a second slope or a second intercept for each of the subset.

In the ensemble performance method, in some embodiments, the controller may also determine the parameter value using the second regression parameters. For example, the parameter values may be determined as a mean value, a median value, a variance value, a standard deviation value, or a root mean square value of the second regression parameters. For example, if the second regression parameters include second slopes of curves 502, the parameter values may be determined as a statistic (e.g., a mean value or a median value) of the second slopes. For another example, if the second regression parameters include second intercepts of curves 502, the parameter values may be determined as the statistic (e.g., a mean value or a median value) of the second intercepts.

In the ensemble performance method, the controller may further determine whether a difference between the first regression parameter and the parameter value is within a predetermined range. For example, the controller may determine whether a difference between the first slope (or first intercept) and the statistic of the second slope (or second intercept) is within the predetermined range. In some embodiments, the predetermined range may be symmetric about the statistic of the parameter value. In some embodiments, the predetermined range may be asymmetric about the statistic of the parameter value.

In the ensemble performance method, the controller may then determine that the abnormality has occurred if the difference is not within the predetermined range. For example, in FIG. 5, if the difference between the first slope of current curve 506 and a mean value of the second slopes of curves 502 is not within the predetermined range, the controller may determine that the abnormality has occurred in current curve 506.

Still referring back to FIG. 3, at step 306, the controller provides an abnormality indication in response to the determination that the abnormality has occurred. In some embodiments, the abnormality indication may include a visual indication, such as a warning (e.g., a popup window) displayed in a graphical user interface (GUI). In some embodiments, the abnormality indication may include an acoustic indication, such as a sound. In some embodiments, the abnormality indication may include a message sent to a user of the multi-beam system, such as a text message. Other forms of abnormality indications may also be used. When the user receives the abnormality indication, the user may start checking whether any problem actually occurs in modules (e.g., hardware modules or software modules) of the multi-beam system. For example, the user may start checking log files associated with the multi-beam system.

In some embodiments, after step 306, the controller may determine a source of the abnormality in response to the determination that the abnormality has occurred. For example, the controller may trigger to run a diagnostic software to identify the source of the abnormality and determine whether the abnormality indicates an actual problem of the multi-beam system.

FIG. 4 is a flowchart illustrating an exemplary method 400 for monitoring performance of a multi-beam system, consistent with embodiments of the present disclosure.

At step 402, a controller (e.g., controller 109 in FIGS. 1-2) determines a baseline value of a performance metric for beams of the multi-beam system in an imaging process. In some embodiments, each record may be associated with one of the beams. For example, the controller may determine the baseline value based on initial records of the performance metric received after a predetermined event. For another example, the controller may determine the baseline value as a statistic of the values of the portion of the records of the performance metric.

At step 404, the controller stores at least one of the baseline value or records in a database. In some embodiments, the database may be included in a memory accessible to the controller.

At step 406, the controller receives records of the performance metric for the beams in the imaging process. In some embodiments, the controller may perform step 406 in a way similar to step 302. For example, the controller may store the received records in the database.

At step 408, the controller retrieves at least one of the records or the baseline value from the database.

At step 410, the controller determines whether an abnormality of a beam occurs based on a parameter value associated with a portion of the records. In some embodiments, the controller may perform step 410 in a way similar to step 304.

At step 412, the controller provides an abnormality indication in response to the determination that the abnormality has occurred. In some embodiments, the controller may perform step 412 in a way similar to step 306.

In some embodiments, after step 412, the controller may determine a source of the abnormality in response to the determination that the abnormality has occurred. For example, the controller may trigger to run a diagnostic software to identify the source of the abnormality and determine whether the abnormality indicates an actual problem of the multi-beam system.

A non-transitory computer readable medium may be provided that stores instructions for a processor (for example, processor of controller 109 of FIG. 1) to carry out image processing, data processing, the self-referencing scheme, database management, graphical display, operations of a charged particle beam apparatus, or another imaging device, or the like. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH- EPROM or any other flash memory, NVRAM, a cache, a register, any other memory chip or cartridge, and networked versions of the same.

The embodiments may further be described using the following claims:

1. A method for monitoring performance of a multi-beam system, the method comprising:
   receiving records of a performance metric for beams of the multi-beam system operating during an imaging process, each record associated with a beam;
   determining whether an abnormality of a beam occurs based on a baseline value determined using a portion of the records; and
   providing an abnormality indication in response to the determination that the abnormality has occurred.

2. The method of clause 1, wherein determining whether the abnormality of the beam occurs comprises:
   determining a test value of the beam using at least one value of a record of the beam received at multiple time points of the imaging process;
   determining whether a difference between the test value of the beam and the baseline value is within a predetermined range; and
   determining that the abnormality has occurred based on the determination that the difference is not within the predetermined range.

3. The method of any one of preceding clauses, further comprising:
   storing at least one of the baseline value or the records in a database.

4. The method of clause 3, further comprising:
   retrieving at least one of the records or the baseline value from the database before determining whether the difference is within the predetermined range.

5. The method of any one of preceding clauses, further comprising:
   determining the baseline value after a predetermined event.

6. The method of clause 5, wherein determining the baseline value after the predetermined event comprises:
   determining the baseline value based on initial records of the performance metric received after the predetermined event.

7. The method of any one of clauses 5-6, wherein the predetermined event comprises completion of one of maintenance of the multi-beam system or calibration of the multi-beam system.

8. The method of any one of clauses 5-7, wherein the predetermined event comprises that each value of the records changes by a shift value, wherein the shift value does not deviate from an average value of the values of the records exceeding a predetermined range.

9. The method of any one of clauses 1-4, further comprising:
   determining the baseline value as a statistic of values of the portion of the records.

10. The method of any one of clauses 2-9, wherein the test value of the beam comprises a statistic of the at least one value of the record of the beam.

11. The method of any one of clauses 9-10, wherein the statistic comprises one of a mean value, a median value, a variance value, a standard deviation value, or a root mean square value.

12. The method of any one of clauses 2-9, wherein the test value of the beam comprises a value of the record of the beam received at one of the multiple time points.

13. The method of any one of preceding clauses, wherein determining whether the abnormality of the beam occurs comprises:

determining a first regression parameter from a regression performed on values of the record received at multiple time points, and second regression parameters from regressions performed on values of each of the portion of the records received at the multiple time points, each of the second regression parameters corresponding to one of the portion of the records;

determining the baseline value using the second regression parameters;

determining whether a difference between the first regression parameter and the baseline value is within a predetermined range; and determining that the abnormality has occurred based on the determination that the difference is not within the predetermined range.

14. The method of clause 13, wherein each of the first regression parameter and the second regression parameters comprises one of a slope or an intercept.

15. The method of any one of clauses 13-14, wherein the portion of the records does not include the record.

16. The method of any one of clauses 13-15, wherein the portion of the records includes all of the records except the record.

17. The method of any one of preceding clauses, wherein the performance metric is indicative of at least one of image quality or geometric distortion of an image generated in the imaging process from a field of view (FOV) of a beam of the beams.

18. The method of clause 17, wherein the performance metric is indicative of the geometric distortion of the image and comprises at least one of aberration, a structural distortion, or a change of a geometric shape.

19. The method of any one of clauses 17-18, wherein the performance metric is indicative of the image quality and comprises a variable representing at least one of a noise level of the image, a brightness of the image, a contrast of the image, a sharpness of the image, or a resolution of the image.

20. The method of clause 19, further comprising:

determining data representing the noise level using a portion of the image corresponding to a region of the FOV, wherein the region has no pattern.

21. The method of clause 20, further comprising:

determining the region based on at least one of layout data of the region of the FOV or image data of the image.

22. The method of any one of clauses 19-21, further comprising:

determining at least one of the brightness or the contrast based on a gray level of the image.

23. The method of any one of clauses 19-22, further comprising:

extracting a step profile from a pattern edge of the image; and determining at least one of the sharpness or the resolution from the step profile.

24. The method of any one of preceding clauses, further comprising:

determining a source of the abnormality in response to the determination that the abnormality has occurred.

25. A system for monitoring performance of a multi-beam system, the system comprising:

a controller having a circuitry to execute a set of instructions to cause the system to:

receive records of a performance metric for beams of the multi-beam system in an imaging process, each record associated with a beam;

determine whether an abnormality of a beam occurs based on a baseline value determined using a portion of the records; and provide an abnormality indication in response to the determination that the abnormality has occurred.

26. The system of clause 25, wherein the set of instructions to cause the system to determine whether the abnormality of the beam occurs further causes the system to:

determine a test value of the beam using at least one value of a record of the beam received at multiple time points of the imaging process;

determine whether a difference between the test value of the beam and the baseline value is within a predetermined range; and determine that the abnormality has occurred based on the determination that the difference is not within the predetermined range.

27. The system of any one of clauses 25-26, further comprising:

a database configured to store at least one of the baseline value or the records.

28. The system of clause 27, wherein the set of instructions further cause the system to:

retrieve at least one of the records or the baseline value from the database before determining whether the difference is within the predetermined range.

29. The system of any one of clauses 25-28, wherein the set of instructions further cause the system to:

determine the baseline value after a predetermined event.

30. The system of clause 29, wherein the set of instructions to cause the system to determine the baseline value after the predetermined event further causes the system to:

determine the baseline value based on initial records of the performance metric received after the predetermined event.

31. The system of any one of clauses 29-30, wherein the predetermined event comprises completion of one of maintenance of the multi-beam system or calibration of the multi-beam system.

32. the system of any one of clauses 29-31, wherein the predetermined event comprises that each value of the records changes by a shift value, wherein the shift value does not deviate from an average value of the values of the records exceeding a predetermined range.

33. The system of any one of clauses 25-28, wherein the set of instructions further cause the system to:

determine the baseline value as a statistic of values of the portion of the records.

34. The system of any one of clauses 26-33, wherein the test value of the beam comprises a statistic of the at least one value of the record of the beam.

35. The system of any one of clauses 33-34, wherein the statistic comprises one of a mean value, a median value, a variance value, a standard deviation value, or a root mean square value.

36. The system of any one of clauses 26-33, wherein the test value of the beam comprises a value of the record of the beam received at one of the multiple time points.

37. The system of any one of clauses 25-36, wherein the set of instructions to cause the system to determine whether the abnormality of the beam occurs further causes the system to:

determine a first regression parameter from a regression performed on values of the record received at multiple time points, and second regression parameters from regressions performed on values of each of the portion of the records received at the multiple time points, each of the second regression parameters corresponding to one of the portion of the records;

determine the baseline value using the second regression parameters;

determine whether a difference between the first regression parameter and the baseline value is within a predetermined range; and determine the abnormality occurs based on a determination that the difference is not within the predetermined range.

38. The system of clause 37, wherein each of the first regression parameter and the second regression parameters comprises one of a slope or an intercept.

39. The system of any one of clauses 25-38, wherein the performance metric is indicative of at least one of image quality or geometric distortion of an image generated in the imaging process from a field of view (FOV) of a beam of the beams.

40. The system of clause 39, wherein the performance metric is indicative of the geometric distortion of the image and comprises at least one of aberration, a structural distortion, or a change of a geometric shape.

41. The system of any one of clauses 39-40, wherein the performance metric is indicative of the image quality and comprises a variable representing at least one of a noise level of the image, a brightness of the image, a contrast of the image, a sharpness of the image, or a resolution of the image.

42. The system of clause 41, wherein the set of instructions further cause the system to:

determine data representing the noise level using a portion of the image corresponding to a region of the FOV, wherein the region has no pattern.

43. The system of clause 42, wherein the set of instructions further cause the system to:

determine the region based on at least one of layout data of the region of the FOV or image data of the image.

44. The system of any one of clauses 41-43, wherein the set of instructions further cause the system to:

determine at least one of the brightness or the contrast based on a gray level of the image.

45. The system of any one of clauses 41-44, wherein the set of instructions further cause the system to:

extract a step profile from a pattern edge of the image; and determine at least one of the sharpness or the resolution from the step profile.

46. The system of any one of clauses 25-45, wherein the set of instructions further cause the system to:

determine a source of the abnormality in response to the determination that the abnormality has occurred.

47. A non-transitory computer-readable medium that stores a set of instructions that is executable by at least one processor of an apparatus to cause the apparatus to perform a method for monitoring performance of a multi-beam system, the method comprising:

receiving records of a performance metric for beams of the multi-beam system in an imaging process, each record associated with a beam;

determining whether an abnormality of a beam occurs based on a baseline value determined using a portion of the records; and providing an abnormality indication in response to the determination that the abnormality has occurred.

48. A method of monitoring health of a multi-beam apparatus, the method comprising:

receiving records of a performance metric for beams of the multi-beam apparatus in an imaging process;

comparing the records to determine whether a beam of the beams exhibits an abnormality; and triggering a notification when the beam exhibits the abnormality.

49. The method of clause 48, wherein the beams comprise three or more beams.

50. The method of any one of clauses 48-49, further comprising:

determining a source of the abnormality in response to the determination that the abnormality has occurred.

51. The method of any one of clauses 48-50, wherein each of the records is associated with one of the beams, and each of the records includes multiple values of the performance metric received at multiple time points of the imaging process.

52. The method of any one of clauses 48-51, wherein comparing the records to determine whether the beam of the beams exhibits the abnormality comprises:

determining a baseline value of the performance metric for the beams;

determining a test value of the beam using at least one value of a record of the beam received at multiple time points of the imaging process;

determining whether a difference between the test value of the beam and the baseline value is within a predetermined range; and determining that the abnormality has occurred based on the determination that the difference is not within the predetermined range.

53. The method of clause 52, further comprising:

storing at least one of the baseline value or the records in a database.

54. The method of clause 53, further comprising:

retrieving at least one of the records or the baseline value from the database before determining whether the difference is within the predetermined range.

55. The method of any one of clauses 52-54, further comprising:

determining the baseline value as a statistic of values of the portion of the records.

56. The method of any one of clauses 52-55, wherein the test value of the beam comprises a statistic of the at least one value of the record of the beam.

57. The method of any one of clauses 55-56, wherein the statistic comprises one of a mean value, a median value, a variance value, a standard deviation value, or a root mean square value.

58. The method of any one of clauses 42-56, wherein the test value of the beam comprises a value of the record of the beam received at one of the multiple time points.

59. The method of any one of clauses 48-58, wherein comparing the records to determine whether the beam of the beams exhibits the abnormality comprises:

determining a first regression parameter from a regression performed on values of the record received at multiple time points, and second regression parameters from regressions performed on values of each of the portion of the records received at the multiple time points, each of the second regression parameters corresponding to one of the portion of the records;

determining the baseline value using the second regression parameters;

determining whether a difference between the first regression parameter and the baseline value is within a predetermined range; and determining that the abnormality has occurred based on the determination that the difference is not within the predetermined range.

60. The method of clause 59, wherein each of the first regression parameter and the second regression parameters comprises one of a slope or an intercept.

61. The method of any one of clauses 59-60, wherein the portion of the records does not include the record.

62. The method of any one of clauses 59-61, wherein the portion of the records includes all of the records except the record.

63. The method of any one of clauses 48-62, wherein the performance metric is indicative of at least one of image quality or geometric distortion of an image generated in the imaging process from a field of view (FOV) of a beam of the beams.

64. The method of clause 63, wherein the performance metric is indicative of the geometric distortion of the image and comprises at least one of aberration, a structural distortion, or a change of a geometric shape.

65. The method of any one of clauses 63-64, wherein the performance metric is indicative of the image quality and comprises a variable representing at least one of a noise level of the image, a brightness of the image, a contrast of the image, a sharpness of the image, or a resolution of the image.

66. The method of clause 65, further comprising:
determining data representing the noise level using a portion of the image corresponding to a region of the FOV, wherein the region has no pattern.

67. The method of clause 66, further comprising:
determining the region based on at least one of layout data of the region of the FOV or image data of the image.

68. The method of any one of clauses 65-67, further comprising:
determining at least one of the brightness or the contrast based on a gray level of the image.

69. The method of any one of clauses 65-68, further comprising:
extracting a step profile from a pattern edge of the image; and
determining at least one of the sharpness or the resolution from the step profile.

70. An apparatus of monitoring health of a multi-beam system, the apparatus comprising:
a controller having a circuitry to execute a set of instructions to cause the apparatus to:
receive records of a performance metric for beams of the multi-beam system in an imaging process;
compare the records to determine whether a beam of the beams exhibits an abnormality; and
trigger a notification when the beam exhibits the abnormality.

71. The apparatus of clause 70, wherein the beams comprise three or more beams.

72. The apparatus of any one of clauses 70-71, wherein the set of instructions further cause the apparatus to:
determine a source of the abnormality in response to the determination that the abnormality has occurred.

73. The apparatus of any one of clauses 70-72, wherein each of the records is associated with one of the beams, and each of the records includes multiple values of the performance metric received at multiple time points of the imaging process.

74. The apparatus of any one of clauses 70-73, wherein the set of instructions to cause the apparatus to compare the records to determine whether the beam of the beams exhibits the abnormality further cause the system to:
determine a baseline value of the performance metric for the beams;
determine a test value of the beam using at least one value of a record of the beam received at multiple time points of the imaging process;
determine whether a difference between the test value of the beam and the baseline value is within a predetermined range; and
determine that the abnormality has occurred based on the determination that the difference is not within the predetermined range.

75. The apparatus of clause 74, wherein the set of instructions further cause the apparatus to:
store at least one of the baseline value or the records in a database.

76. The apparatus of clause 75, wherein the set of instructions further cause the apparatus to:
retrieve at least one of the records or the baseline value from the database before determining whether the difference is within the predetermined range.

77. The apparatus of any one of clauses 74-76, wherein the set of instructions further cause the apparatus to:
determine the baseline value as a statistic of values of the portion of the records.

78. The apparatus of any one of clauses 74-77, wherein the test value of the beam comprises a statistic of the at least one value of the record of the beam.

79. The apparatus of any one of clauses 77-78, wherein the statistic comprises one of a mean value, a median value, a variance value, a standard deviation value, or a root mean square value.

80. The apparatus of any one of clauses 74-78, wherein the test value of the beam comprises a value of the record of the beam received at one of the multiple time points.

81. The apparatus of any one of clauses 70-80, wherein the set of instructions to cause the apparatus to compare the records to determine whether the beam of the beams exhibits the abnormality further cause the system to:
determine a first regression parameter from a regression performed on values of the record received at multiple time points, and second regression parameters from regressions performed on values of each of the portion of the records received at the multiple time points, each of the second regression parameters corresponding to one of the portion of the records;
determine the baseline value using the second regression parameters;
determine whether a difference between the first regression parameter and the baseline value is within a predetermined range; and
determine that the abnormality has occurred based on the determination that the difference is not within the predetermined range.

82. The apparatus of clause 81, wherein each of the first regression parameter and the second regression parameters comprises one of a slope or an intercept.

83. The apparatus of any one of clauses 81-82, wherein the portion of the records does not include the record.

84. The apparatus of any one of clauses 81-83, wherein the portion of the records includes all of the records except the record.

85. The apparatus of any one of clauses 70-84, wherein the performance metric is indicative of at least one of image quality or geometric distortion of an image generated in the imaging process from a field of view (FOV) of a beam of the beams.

86. The apparatus of clause 85, wherein the performance metric is indicative of the geometric distortion of the image and comprises at least one of aberration, a structural distortion, or a change of a geometric shape.

87. The apparatus of any one of clauses 85-86, wherein the performance metric is indicative of the image quality and comprises a variable representing at least one of a noise level of the image, a brightness of the image, a contrast of the image, a sharpness of the image, or a resolution of the image.

88. The apparatus of clause 87, wherein the set of instructions further cause the apparatus to:
determine data representing the noise level using a portion of the image corresponding to a region of the FOV, wherein the region has no pattern.

89. The apparatus of clause 88, wherein the set of instructions further cause the apparatus to:
determine the region based on at least one of layout data of the region of the FOV or image data of the image.

90. The apparatus of any one of clauses 87-89, wherein the set of instructions further cause the apparatus to:
determine at least one of the brightness or the contrast based on a gray level of the image.

91. The apparatus of any one of clauses 87-90, wherein the set of instructions further cause the apparatus to:
extracting a step profile from a pattern edge of the image; and
determine at least one of the sharpness or the resolution from the step profile.

92. A non-transitory computer-readable medium that stores a set of instructions that is executable by at least one processor of an apparatus to cause the apparatus to perform a method for monitoring health of a multi-beam system, the method comprising:
receiving records of a performance metric for beams of the multi-beam system in an imaging process;
comparing the records to determine whether a beam of the beams exhibits an abnormality; and
triggering a notification when the beam exhibits the abnormality.

93. A method of monitoring health of a multi-beam scanning electron microscope (SEM), the method comprising:
receiving records of a performance metric for a plurality of beams of a multi-beam system, the plurality of beams including a first beam and other beams;
comparing data derived from the records to determine whether the first beam exhibits abnormal performance as compared to the other beams; and
triggering a notification when a determination is made, based on the comparison, that the first beam exhibits the abnormal performance.

94. The method of clause 93, wherein comparing the data further comprises:
determining a statistic of the performance metric for the other beams; and
determining that a difference between the performance metric for the first beam and the statistic is greater than or equal to a predetermined threshold.

95. The method of clause 93, wherein the statistic comprises one of a mean value, a median value, a variance value, a standard deviation value, or a root mean square value of the performance metric for the other beams.

The block diagrams in the figures illustrate the architecture, functionality, and operation of possible implementations of systems, methods, and computer hardware or software products according to various exemplary embodiments of the present disclosure. In this regard, each block in a flowchart or block diagram may represent a module, segment, or portion of code, which includes one or more executable instructions for implementing the specified logical functions. It should be understood that in some alternative implementations, functions indicated in a block may occur out of the order noted in the figures. For example, two blocks shown in succession may be executed or implemented substantially concurrently, or two blocks may sometimes be executed in reverse order, depending upon the functionality involved. Some blocks may also be omitted. It should also be understood that each block of the block diagrams, and combination of the blocks, may be implemented by special purpose hardware-based systems that perform the specified functions or acts, or by combinations of special purpose hardware and computer instructions.

It will be appreciated that the embodiments of the present disclosure are not limited to the exact construction that has been described above and illustrated in the accompanying drawings, and that various modifications and changes may be made without departing from the scope thereof.

The invention claimed is:

1. A method for monitoring performance of a multi-beam system, the method comprising:
monitoring a performance metric of at least two beams of a plurality of beams of the multi-beam system operating simultaneously during an imaging process, wherein the performance metric of the at least two beams comprises an image parameter or geometric distortion of a first image generated from the imaging process from a field of view (FOV) of a first beam the at least two beams of the plurality of beams and a second image generated from the imaging process of a FOV of a second beam of the at least two beams of the plurality of beams, and wherein the image parameter comprises a noise parameter, an image sharpness parameter, or a resolution parameter;
receiving records of the performance metric of the plurality of beams of the multi-beam system operating during an imaging process, each record associated with a beam of the plurality of beams;
calculating a baseline value of the performance metric of the plurality of beams from a portion of the records;
determining whether an abnormality of the first beam of the at least two beams of the plurality of beams or the second beam of the at least two beams of the plurality of beams occurs based on the calculated baseline value;
providing an abnormality indication in response to the determination that the abnormality has occurred; and
determining, in response to the abnormality indication, whether a source of the abnormality is in the multi-beam system.

2. A system for monitoring performance of a multi-beam system, the system comprising:

a controller having a circuitry to execute a set of instructions to cause the system to:

monitor a performance metric of at least two beams of a plurality of beams of the multi-beam system operating simultaneously during an imaging process, wherein the performance metric of the at least two beams comprises an image parameter or geometric distortion of a first image generated from the imaging process from a field of view (FOV) of a first beam of the at least two beams of the plurality of beams and a second image generated from the imaging process of a FOV of a second beam of the at least two beams of the plurality of beams, and wherein the image parameter comprises a noise parameter, an image sharpness parameter, or a resolution parameter;

receive records of the performance metric of the plurality of beams of the multi-beam system during the imaging process, each record associated with a beam of the plurality of beams;

calculate a baseline value of the performance metric for the plurality of beams from a portion of the records;

determine whether an abnormality of the first beam of the at least two beams of the plurality of beams or the second beam of the at least two beams of the plurality of beams occurs based on the calculated baseline value;

provide an abnormality indication in response to the determination that the abnormality has occurred; and determine, in response to the abnormality indication, whether a source of the abnormality is in the multi-beam system.

3. The system of claim 2, wherein the set of instructions to cause the system to determine whether the abnormality of the first beam of the at least two beams of the plurality of beams or the second beam of the at least two beams of the plurality of beams occurs further causes the system to:

determine a test value of the first beam or the second beam of the plurality of beams using at least one value of a record of the first beam or the second beam received at multiple time points of the imaging process;

determine whether a difference between the test value of the first beam or the second beam of the plurality of beams and the baseline value is within a predetermined range; and determine that the abnormality has occurred based on the determination that the difference is not within the predetermined range.

4. The system of claim 3, wherein the test value of the first beam or the second beam of the plurality of beams comprises a statistic of the at least one value of the record of the first beam or the second beam of the plurality of beams.

5. The system of claim 2, further comprising:

a database configured to store at least one of the baseline value or the records.

6. The system of claim 5, wherein the set of instructions further cause the system to:

retrieve at least one of the records or the baseline value from the database before determining whether the difference is within the predetermined range.

7. The system of claim 2, wherein the set of instructions further cause the system to:

calculate the baseline value after a predetermined event.

8. The system of claim 7, wherein the set of instructions to cause the system to calculate the baseline value after the predetermined event further causes the system to:

calculate the baseline value based on initial records of the performance metric received after the predetermined event.

9. The system of claim 7, wherein the predetermined event comprises completion of one of maintenance of the multi-beam system or calibration of the multi-beam system.

10. The system of claim 7, wherein the predetermined event comprises that each value of the records changes by a shift value, wherein the shift value does not deviate from an average value of the values of the records exceeding a predetermined range.

11. The system of claim 2, wherein the set of instructions further cause the system to:

calculate the baseline value as a statistic of values of the portion of the records.

12. The system of claim 11, wherein the statistic comprises one of a mean value, a median value, a variance value, a standard deviation value, or a root mean square value.

13. The system of claim 3, wherein the test value of the first beam or the second beam of the plurality of beams comprises a value of the record of the first beam or the second beam received at one of the multiple time points.

14. The system of claim 2, wherein the set of instructions to cause the system to determine whether the abnormality of the first beam of the plurality of beams or the second beam of the at least two beams of the plurality of beams occurs further causes the system to:

determine a first regression parameter from a regression performed on values of the record received at multiple time points, and second regression parameters from regressions performed on values of each of the portion of the records received at the multiple time points, each of the second regression parameters corresponding to one of the portion of the records;

determine the baseline value using the second regression parameters;

determine whether a difference between the first regression parameter and the baseline value is within a predetermined range; and determine the abnormality occurs based on a determination that the difference is not within the predetermined range.

15. A non-transitory computer-readable medium that stores a set of instructions that is executable by at least one processor of an apparatus to cause the apparatus to perform a method for monitoring performance of a multi-beam system, the method comprising:

monitoring a performance metric of at least two beams of a plurality of beams of the multi-beam system operating simultaneously during an imaging process, wherein the performance metric of the at least two beams comprises an image parameter or geometric distortion of a first image generated from the imaging process from a field of view (FOV) of a first beam of the at least two beams of the plurality of beams and a second image generated from the imaging process of a FOV of a second beam of the at least two beams of the plurality of beams, and wherein the image parameter comprises a noise parameter, an image sharpness parameter, or a resolution parameter;

receiving records of the performance metric of the plurality of beams of the multi-beam system during the imaging process, each record associated with a beam of the plurality of beams;

calculating a baseline value of the performance metric of the plurality of beams from a portion of the records;

determining whether an abnormality of the first beam of the at least two beams of the plurality of beams or the second beam of the at least two beams of the plurality of beams occurs based on the calculated baseline value;

providing an abnormality indication in response to the determination that the abnormality has occurred; and determining, in response to the abnormality indication, whether a source of the abnormality is in the multi-beam system.

\* \* \* \* \*